(12) United States Patent
Appenzeller et al.

(10) Patent No.: US 10,505,109 B1
(45) Date of Patent: Dec. 10, 2019

(54) PHASE TRANSITION BASED RESISTIVE RANDOM-ACCESS MEMORY

(71) Applicant: Purdue Research Foundation, West Lafayette, IN (US)

(72) Inventors: Joerg Appenzeller, West Lafayette, IN (US); Feng Zhang, West Lafayette, IN (US); Yuqi Zhu, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 15/987,867

(22) Filed: May 23, 2018

(51) Int. Cl.
*G11C 11/00* (2006.01)
*H01L 45/00* (2006.01)
*G11C 13/00* (2006.01)

(52) U.S. Cl.
CPC ...... *H01L 45/1253* (2013.01); *G11C 13/0007* (2013.01); *H01L 45/146* (2013.01); *H01L 45/1616* (2013.01)

(58) Field of Classification Search
CPC .......... H01L 45/1253; H01L 45/1616; H01L 45/146; G11C 13/0007
USPC ........................................... 365/148
See application file for complete search history.

(56) References Cited

U.S. PATENT DOCUMENTS

| 7,129,133 | B1* | 10/2006 | Avanzino | H01L 51/0591 438/244 |
| 8,415,652 | B2* | 4/2013 | Yang | G11C 13/0007 257/4 |
| 8,455,852 | B2* | 6/2013 | Quitoriano | B82Y 10/00 257/2 |
| 8,575,585 | B2* | 11/2013 | Yang | H01L 45/145 257/2 |
| 9,831,427 | B1* | 11/2017 | Haase | H01L 45/12 |
| 2012/0104347 | A1* | 5/2012 | Quick | H01L 27/2436 257/4 |
| 2013/0221307 | A1* | 8/2013 | Wang | H01L 45/10 257/2 |
| 2017/0047512 | A1* | 2/2017 | Bessonov | H01G 7/06 |

OTHER PUBLICATIONS

Appenzeller et al., Chapter 8:Transition Metal Dichalcogenide Schottky Barrier Transistors—A Device Analysis and Material Comparison, 2D Materials for Nanoelectronics, 2016, 207-240, CRC Press/Taylor & Francis Group, LLC.
Zhang et al., Electric field induced semiconductor-to-metal phase transition in vertical MoTe2 and Mo1-xWxTe2 devices. 2017, arXiv preprint arXiv:1709.03835.

(Continued)

*Primary Examiner* — Tha-O H Bui
(74) *Attorney, Agent, or Firm* — Piroozi-IP, LLC

(57) ABSTRACT

A resistive random access memory (Device) is disclosed. The Device includes a substrate, a first electrode formed atop the substrate, a tunneling barrier layer formed atop the first electrode, an active material formed atop the tunneling barrier layer, an isolation layer formed atop the active material, and a second electrode formed atop the isolation layer, the first electrode and the second electrode provide electrical connectivity to external components, where the active material is a phase change material which undergoes phase transition in the presence of an electric field, Joule heating, or a combination thereof.

15 Claims, 14 Drawing Sheets

(56) References Cited

OTHER PUBLICATIONS

Wong et al., Metal-oxide RRAM, 2012, 1951-1970, vol. 100, No. 6, Proc. IEEE.
Yang et al., Memristive devices for computing, 2013, vol. 8., 13-24, Nature Nanotech.
Zhu et al., Vertical charge transport through transition metal dichalcogenides—a quantitative analysis. 2017, 9, 19108-19113, Nanoscale.

* cited by examiner

US 10,505,109 B1

PHASE TRANSITION BASED RESISTIVE RANDOM-ACCESS MEMORY

STATEMENT REGARDING GOVERNMENT FUNDING

This invention was made with government support under HR0011-13-3-0002 awarded by the Department of Defense/Defense Advanced Research Projects Agency (DARPA). The government has certain rights in the invention.

TECHNICAL FIELD

The present disclosure generally relates to memory devices, and in particular, to resistive random-access memory (RRAM) cells.

BACKGROUND

This section introduces aspects that may help facilitate a better understanding of the disclosure. Accordingly, these statements are to be read in this light and are not to be understood as admissions about what is or is not prior art.

Resistive random-access memory (RRAM)-based technology has gained attention of the semiconductor industry and researchers working at the forefront of emerging technologies due to its potential scalability, high operation speed, high endurance and ease of process flow. RRAM devices are typically two-terminal cells whose operation are based on changing the resistive state of an internal element to thereby store information in a nonvolatile fashion by applying a sufficiently high voltage or by driving a large enough current through the cell.

Typically, two types of switching mechanisms are distinguished in RRAM devices. According to one type, valence change memory (VCM), oxide-based resistive random-access memory cells follow a resistive switching mechanism in which a cluster of localized valence changes lead to formation of a filament from a high resistive state to a low resistive state resulting in the electromigration of induced anions which modifies the valence states of the cations. According to another type, RRAM devices operating based on the electrochemical metallization rely on the anodic dissolution (oxidation) of an active metal electrode and electrodeposition (reduction) of the metal ions inside the active switching material.

However, the observed RRAM behavior in both of the above described instances involves an uncontrollable movement of individual atoms. Accordingly, reliability aspects represent a substantial challenge.

Therefore, there is an unmet need in the art for a new switching mechanism that can be used in RRAM cells and systems.

SUMMARY

A resistive random access memory is disclosed. The resistive random access memory includes a substrate, a first electrode formed atop the substrate, a tunneling barrier layer formed atop the first electrode, an active material formed atop the tunneling barrier layer, an isolation layer formed atop the active material, and a second electrode formed atop the isolation layer, the first electrode and the second electrode provide electrical connectivity to external components. The active material is a phase change material which undergoes phase transition in the presence of an electric field, Joule heating, or a combination thereof.

A resistive random access memory is disclosed. The resistive random access memory includes a substrate, a first electrode formed atop the substrate, an active material formed atop the first electrode, an isolation layer formed atop the active material, and a second electrode formed atop the isolation layer, the first electrode and the second electrode provide electrical connectivity to external components. The active material is a phase change material which undergoes phase transition in the presence of an electric field, Joule heating, or a combination thereof.

DETAILED DESCRIPTION

Figure 1:
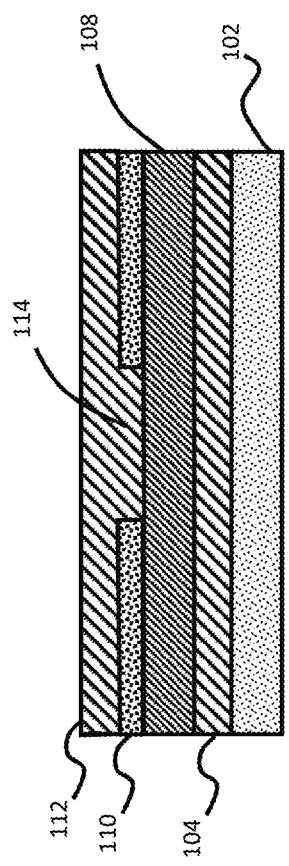
FIG. 1 is a schematic view of a cross section of a resistive random-access memory (RRAM) cell according to the present disclosure.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure, the term "about" can allow for a degree of variability in a value or range, for example, within 10%, within 5%, or within 1% of a stated value or of a stated limit of a range.

In the present disclosure, the term "substantially" can allow for a degree of variability in a value or range, for example, within 90%, within 95%, or within 99% of a stated value or of a stated limit of a range.

The present disclosure relates to a new resistive random-access memory (RRAM) device arrangement. The active material is made from phase transition materials, e.g.

MoTe$_2$, GaTe, ReSe$_2$, ReS$_2$, or other such materials known to a person having ordinary skill in the art. These classes of materials may be used in fabrication of neuromorphic computing, in-memory computing or memristor-based nonvolatile logic circuits and devices.

A novel switching mechanism that can be used in RRAM cells and systems. A method for fabricating this novel switching mechanism is also provided.

The RRAM topology described in the present disclosure is based on a class of electric field induced phase transition materials (also referred to as the active material, herein). By applying an electrical field to this active material, the cell is transformed from a high resistive state (HRS) to a low resistive state (LRS). This transformation can be viewed as setting the cell to a value of "1". By reversing the electrical field, the cell can be transformed from the LRS back to the HRS, i.e., resetting the cell back to "0".

Figure 7A:
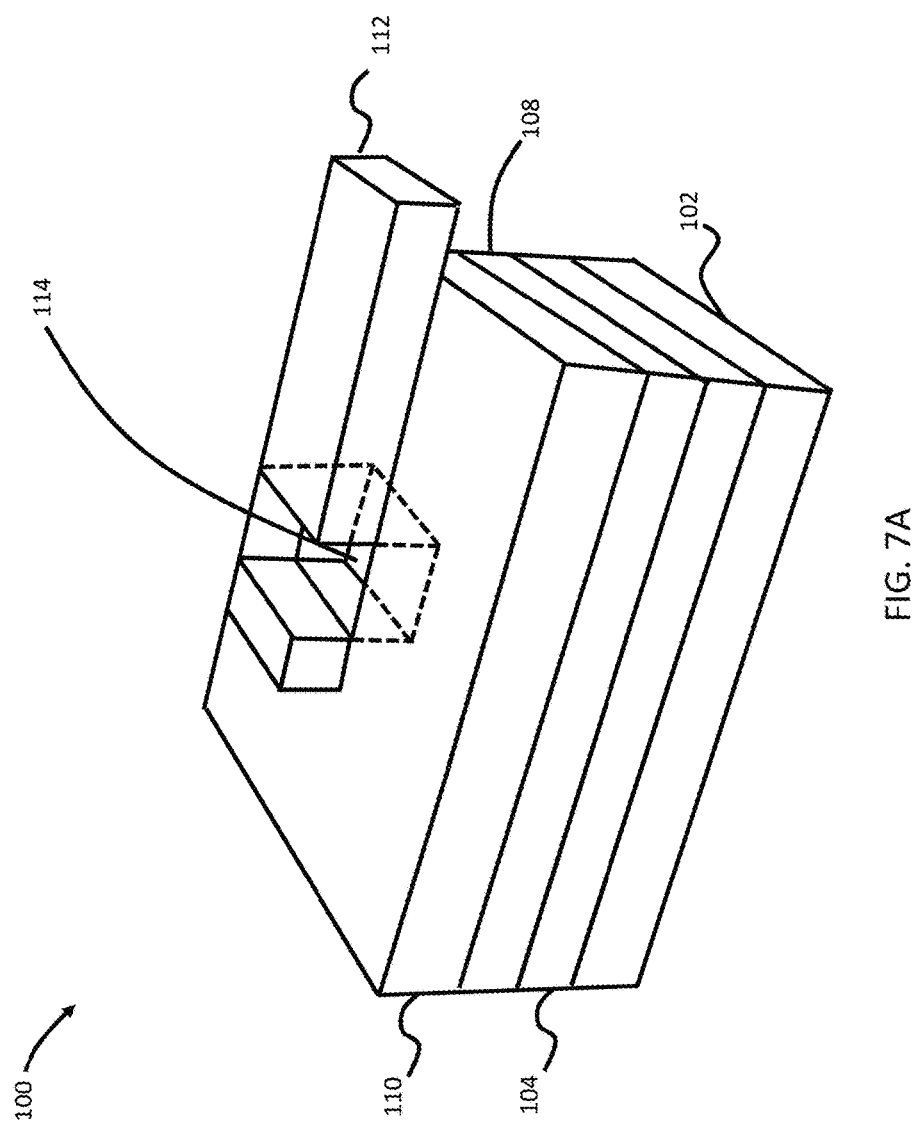
FIG. 7A is a perspective schematic of a vertical transition metal dichalcogenide (TMD) RRAM device of FIG. 1.

Now referring to FIG. 1, an exemplary embodiment of a cell 100 according to the present disclosure is provided. The cell 100 includes a substrate 102, a first electrode 104 formed atop the substrate 102 and an active material 108 formed atop the first electrode 104. On the active material (also referred to as the active material layer) 108 is an isolation layer 110 atop and within which is a second electrode 112 formed. The first electrode 104 and the second electrode 112 provide electrical connectivity to the cell 100. A perspective view of the cell 100 is shown in FIG. 7A representing one exemplary embodiment of the second 112 electrode and its disposition with respect to the active material layer 108 and the isolation layer 110.

The substrate 102 in FIG. 1 can be made from a variety of suitable materials known to a person having ordinary skill in the semiconductor art. For example, the substrate 102 can be made from silicon, silicon dioxide, glass, sapphire, germanium, gallium arsenide, indium phosphate, alloys of silicon and germanium, titanium oxide, single polymer, such as polyethylene (PE), biaxially oriented polypropylene (BOPP), polyethylene terephthalate (PET), polyvinyl chloride (PVC) and the like including flexible substrates. The electrodes 104 and 112 are made from typical material suitable for electrodes known to a person having ordinary skill in the semiconductor art. For example, the electrodes 104 and 112 can be made from aluminum, copper, gold, silver, polysilicon, molybdenum, nickel, indium tin oxide (ITO), graphene, carbon nanotubes (CNT), silver nanowires (AgNWs), conductive polymer and the like including flexible conductors. The electrodes 104 and 112 are formed by, e.g., deposition, e.g., by chemical vapor deposition (CVD), e.g., thermal CVD or plasma-enhanced CVD; or physical vapor deposition (PVD), e.g., sputtering or evaporation. The electrodes 104 and 112 make Schottky contacts between the electrode material and the neighboring semiconductor material.

The active material 108 is formed on the first electrode 104. The active material 108 is made from electric field induced phase transition materials, e.g. MoTe$_2$, GaTe, ReSe$_2$, ReS$_2$, or other such materials known to a person having ordinary skill in the art. The phase transition materials discussed herein can change phase based on inducement of electric field, by joules heating, or a combination thereof. Suitable methods for forming the active material 108 include CVD growth or exfoliated from bulk materials. The thickness of the active material layer 108 depends on what set/reset voltage RRAM devices require as will be discussed below. However, suffice it to say that according to one embodiment of the present disclosure the thickness is between about 0.6 nm and 40 nm.

The isolation layer 110 is used to ensure that only vertical transport occurs from the first electrode 104 to the second electrode 112 without any lateral transport contributions. The thickness of the isolation layer 110 depends on the applied voltage (described in FIG. 3) to ensure that no leakage current exists in the chosen layout. An open window 114 can be formed in the isolation layer 110 which size depends on the need of device area. The isolation layer 110 may be formed from silicon dioxide (SiO$_2$), boron nitride (BN) or metal oxide materials, such as aluminum oxide (Al$_2$O$_3$), hafnium dioxide (HfO$_2$), or polymers and other isolation material used in the semiconductor industry known to a person having ordinary skill in the art. The open window 114 can be formed by first applying a selective protective (resist) layer and then applying a buffered hydrofluoric acid (HF) to dissolve unprotected regions of the isolation material in case of SiO$_2$. The photoresist is removed by a chemical solution or by oxidizing in an oxygen plasma or a UV ozone system, as known to a person having ordinary skill in the art. An alternative way is reactive-ion etching (RIE), known to a person having ordinary skill in the art.

The window 114 allows electrical contact between the second electrode 112 and the active material layer 108. While a window is shown, it should be appreciated that a network of vias can also be used, as known to a person having ordinary skill in the art. In one embodiment, the window 114 can be sized as small as the minimum feature size of the technology utilized, however, according to one embodiment between about 20 nm to about 2 μm in width and about 20 nm to about 2 μm in length. Alternatively, a network of vias providing substantially the same amount of surface area can also be used.

Figure 2:
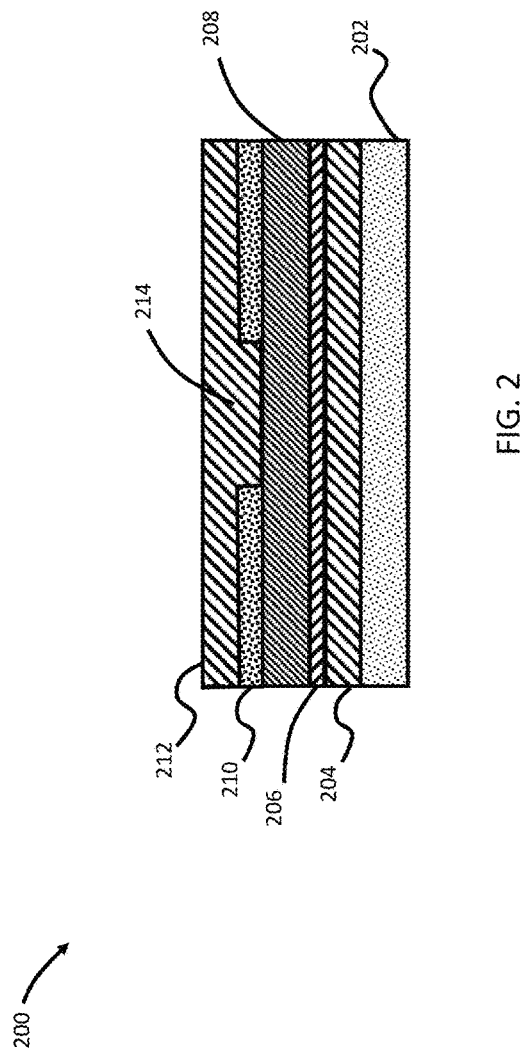
FIG. 2 is a schematic view of a cross section of another RRAM cell according to the present disclosure.

Referring to FIG. 2, another exemplary embodiment of a cell 200 according to the present disclosure is provided. The cell 200 includes a substrate 202, a first electrode 204 formed atop the substrate 202 and a tunneling barrier layer 206 formed atop the first electrode 204. The tunneling barrier 206 works to reduce the set/reset current level in the device 200, as will be discussed in greater detail below. The tunneling barrier 206 may be formed from silicon dioxide (SiO$_2$) or metal oxide materials, such as aluminum oxide (Al$_2$O$_3$), hafnium dioxide (HfO$_2$), boron nitride (BN), other two-dimensional (2D) materials such as MoS$_2$, WSe$_2$, MoSe$_2$ and the like including 2D insulators that do not undergo a phase transition. The thickness of the tunneling barrier 206 depends on the requirement of set/reset current levels. Atop the tunneling barrier layer 206 is a layer of active material 208. Atop the active material (also referred to as the active material layer) 208 is an isolation layer 210 atop which is a second electrode 212 formed. The first electrode 204 and the second electrode 212 provide electrical connectivity to the cell 200. The tunneling barrier layer 206 and the active material layer 208 can swap positions. Additionally, the tunneling barrier layer 206 can be provided on both sides of the active material layer 208 referring to a construction including the first electrode 204—the tunneling layer 206—the active material layer 208—the tunneling layer 206.

The substrate 202 can be made from a variety of suitable materials known to a person having ordinary skill in the semiconductor art. For example, the substrate 202 can be made from silicon, silicon dioxide, glass, sapphire, germanium, gallium arsenide, indium phosphate, alloys of silicon and germanium, titanium oxide, single polymer, such as polyethylene (PE), biaxially oriented polypropylene (BOPP), polyethylene terephthalate (PET), polyvinyl chloride (PVC) and the like including flexible substrates. The electrodes 204 and 212 are made from typical materials suitable for electrodes known to a person having ordinary skill in the semiconductor art. For example, the electrodes 204 and 212 can be made from aluminum, copper, gold, silver, polysilicon, molybdenum, nickel, indium tin oxide (ITO), graphene, carbon nanotubes (CNT), silver nanowires (AgNWs), conductive polymer and the like including flexible conductors. The electrodes 204 and 212 are formed by, e.g., deposition, e.g., by chemical vapor deposition (CVD), e.g., thermal CVD or plasma-enhanced CVD; or physical vapor deposition (PVD), e.g., sputtering or evaporation. The electrodes 204 and 212 make Schottky contacts between the electrode material and the neighboring semiconductor material.

The active material 208 is formed on the first electrode 204. The active material 208 is made from electric field induced phase transition materials, e.g. $MoTe_2$, GaTe, $ReSe_2$, $ReS_2$, or other such materials known to a person having ordinary skill in the art. Suitable methods for forming the active material 208 include CVD growth or exfoliated from bulk materials. The thickness of the active material layer 208 depends on what set/reset voltage RRAM devices require as will be discussed below. However, suffice it to say that according to one embodiment of the present disclosure the thickness is between about 0.6 nm and 40 nm.

The isolation layer 210 is used to ensure that only vertical transport occurs from the first electrode 204 to the second electrode 212 without any lateral transport contributions. The thickness of the isolation layer 210 depends on the applied voltage (described in FIG. 3) to ensure that no leakage current exists in the chosen layout. An open window 214 can be formed in the isolation layer 210 which size depends on the need of device area. The isolation layer 210 may be formed from silicon dioxide ($SiO_2$), boron nitride (BN) or metal oxide material, such as aluminum oxide ($Al_2O_3$), hafnium dioxide ($HfO_2$), other two-dimensional (2D) materials such as $MoS_2$, $WSe_2$, $MoSe_2$ and the like including 2D insulators that do not undergo a phase transition or polymers and other isolation material used in the semiconductor industry known to a person having ordinary skill in the art. The open window 214 can be formed by first applying a selective protective (resist) layer and then applying a buffered hydrofluoric acid (HF) in case of $SiO_2$ to dissolve unprotected regions of the isolation material. The photoresist is removed by a chemical solution or by oxidizing in an oxygen plasma or a UV ozone system, as known to a person having ordinary skill in the art.

The window 214 allows electrical contact between the second electrode 212 and the active material layer 208. While a window is shown, it should be appreciated that a network of vias can also be used, as known to a person having ordinary skill in the art. In one embodiment, the window 214 can be sized between about 20 nm to about 2 µm in width and about 20 nm to about 2 µm in length in length. Alternatively, a network of vias providing substantially the same amount of surface area can also be used.

Figure 3:
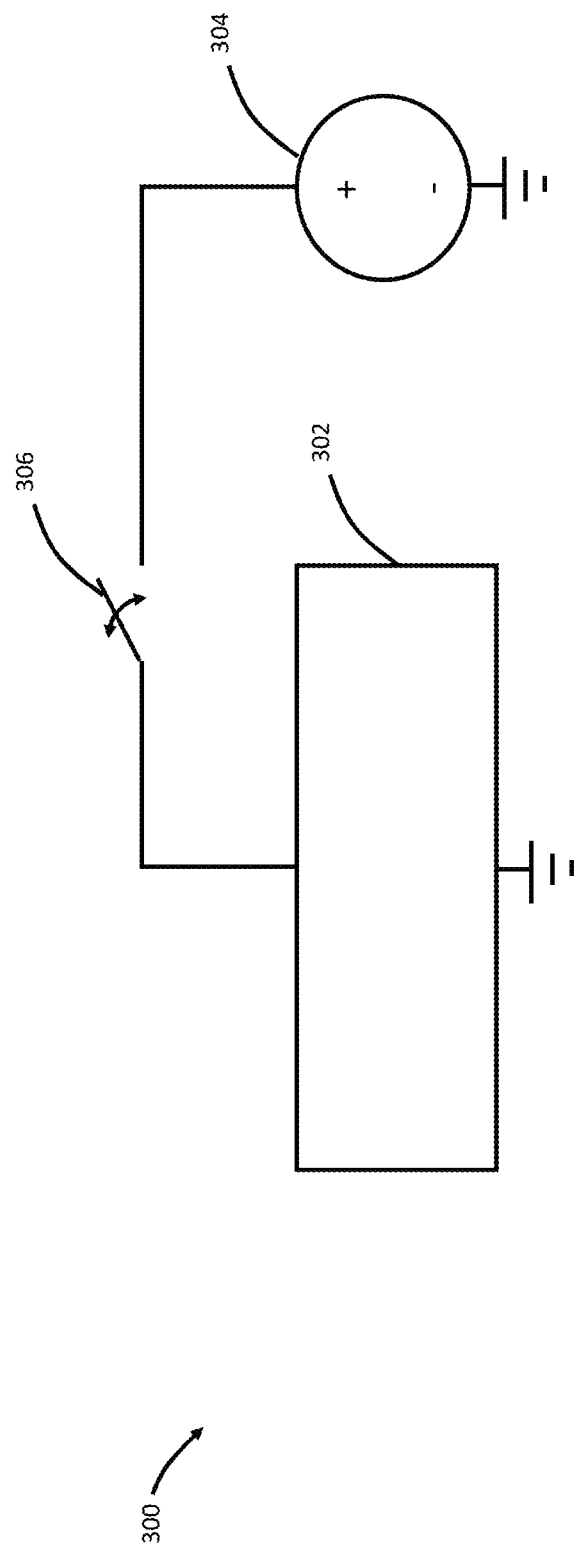
FIG. 3 is a schematic of a system, according to the present disclosure, where a cell according to the present disclosure is coupled to a selectable source via a switch.

Referring to FIG. 3, a system 300 is shown where a cell 302 is coupled to a selectable source 304 via a switch 306. The source 304 is configured to provide a positive and a negative voltage in order to set and reset the cell 302. The cell 302 as described above can be any of the exemplary embodiments 100 or 200. The switch 306 isolates the device 302 from the source 304, allowing the device 302 to remain in its non-volatile state. In operation, the source 304 applies controlled positive potentials (or alternatively negative potentials) to the second electrode (112 or 212 in FIG. 1 or 2). Note that the cell 302 shown may be part of a larger cross bar geometry or other high-density memory array.

Figure 4:
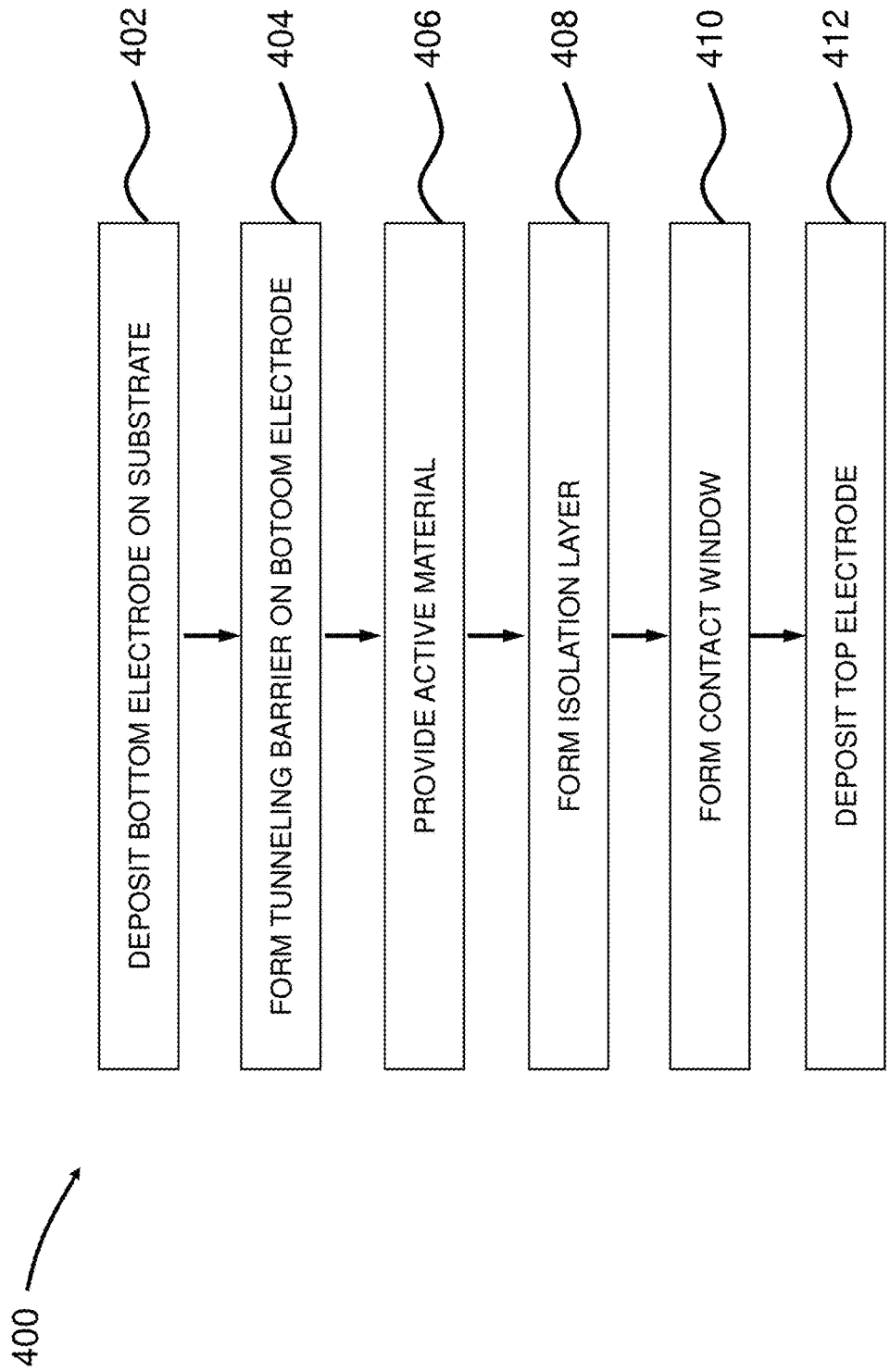
FIG. 4 is a flowchart depicting a method that represents an exemplary process for making the cells, according to the present disclosure.

Referring to FIG. 4, a method 400 is shown that represents an exemplary process for making the cells 100 and 200, according to the present disclosure. The method 400 is based on a flow diagram for one embodiment of the present disclosure of fabricating phase transition-based RRAMs. The method 400 includes process steps that are performed upon a substrate (102, 202 in FIGS. 1 and 2). In one illustrative embodiment, such processing steps are sequentially performed in the depicted order. In alternate embodiments, at least two processing steps may be performed contemporaneously or in a different order. For the device without tunneling barriers (e.g., the device 100 of FIG. 1), the step 404 of FIG. 4 is eliminated. Conventional sub-processes, such as application and removal of lithographic masks or sacrificial and protective layers, cleaning processes, and the like, are well known in the art and are not shown in the method 400. At step 402 of FIG. 4, a first electrode (104 or 204 in FIG. 1 or 2) is formed on the substrate (102 or 202 in FIG. 1 or 2).

At step 406 of FIG. 4, the active material layer (108 or 208 in FIG. 1 or 2) is formed on the first electrode (104 or 204 in FIG. 1 or 2). Methods suitable for forming such active material layer, e.g. $MoTe_2$, GaTe, $ReSe_2$, $ReS_2$, are CVD growth or exfoliated from bulk materials. The thickness of the active layer (108 or 208 in FIG. 1 or 2) depends on set/reset voltage which RRAM devices require, as described in fuller detail below. At step 408 of FIG. 4, an isolation layer (110 or 210 in FIG. 1 or 2) is formed upon the active material layer (108 or 208 in FIG. 1 or 2). The isolation layer (110 or 210 in FIG. 1 or 2) is used to ensure that only vertical transport occurs from the first electrode (104 or 204 in FIG. 1 or 2) to the second electrode (112 or 212 in FIG. 1 or 2) without any lateral transport contributions. The thickness of the isolation layer (110 or 210 in FIG. 1 or 2) depends on the voltage of the voltage source 304 (shown in FIG. 3) to ensure that no leakage current exists in the chosen layout. At step 410 of FIG. 4, a contact window (114 or 214 in FIG. 1 or 2) is formed in isolation layer (110 or 210 in FIG. 1 or 2) upon the active material layer (108 or 208 in FIG. 1 or 2). The window allows electrical contact between the second electrode (112 or 212 in FIG. 1 or 2) and the active material layer (108 or 208 in FIG. 1 or 2).

At step 412 of FIG. 4, the second electrode (112 or 212 in FIG. 1 or 2) is formed upon the isolation layer (110 or 210 in FIG. 1 or 2), coupling to the active material layer (108 or 208 in FIG. 1 or 2). The first electrode (104 or 204 in FIG. 1 or 2) and the second electrode (112 or 212 in FIG. 1 or 2) may be formed from at least one conductive material (e.g., a metal, an alloy of the metal, or a conductive compound) that is compatible with respective underlying and overlying material layers, as discussed above. In step 404 of FIG. 4, the tunneling barrier layer (206 in FIG. 2) is formed upon the first electrode (204 in FIG. 2) to reduce the set/reset current level in device 200. The tunneling barrier layer (206 in FIG. 2) may be formed from silicon dioxide ($SiO_2$) or metal oxide materials, such as aluminum oxide ($Al_2O_3$), hafnium dioxide ($HfO_2$), boron nitride (BN), other two-dimensional (2D) materials such as $MoS_2$, $WSe_2$, $MoSe_2$ and the like including 2D insulators that do not undergo a phase transition or polymers and other isolation material used in the semiconductor industry known to a person having ordinary skill in the art. The thickness of the tunneling barrier (206 in FIG. 2) depends on the requirement of set/reset current levels. In one exemplary embodiment, the tunneling barrier (206 in FIG. 2) comprises 4.5 nm thick aluminum oxide ($Al_2O_3$). A 3 nm thick aluminum (Al) layer was deposited onto the first electrode (204 in FIG. 2) prior to oxidation of the Al in an oxygen rich environment at around 250° C. for 6 h. The set/reset current for this embodiment is $10^{-7}$ A. It should be appreciated that the structures discussed herein are symmetrical with respect to the first electrode (104 or 204 in FIG. 1 or 2) and the second electrode (112 or 212 in FIG. 1 or 2). Therefore, the same procedures and structures discussed can be repeated with the tunneling barrier layer (206 in FIG. 2) being formed against the second electrode (212 in FIG. 2).

Figure 5:
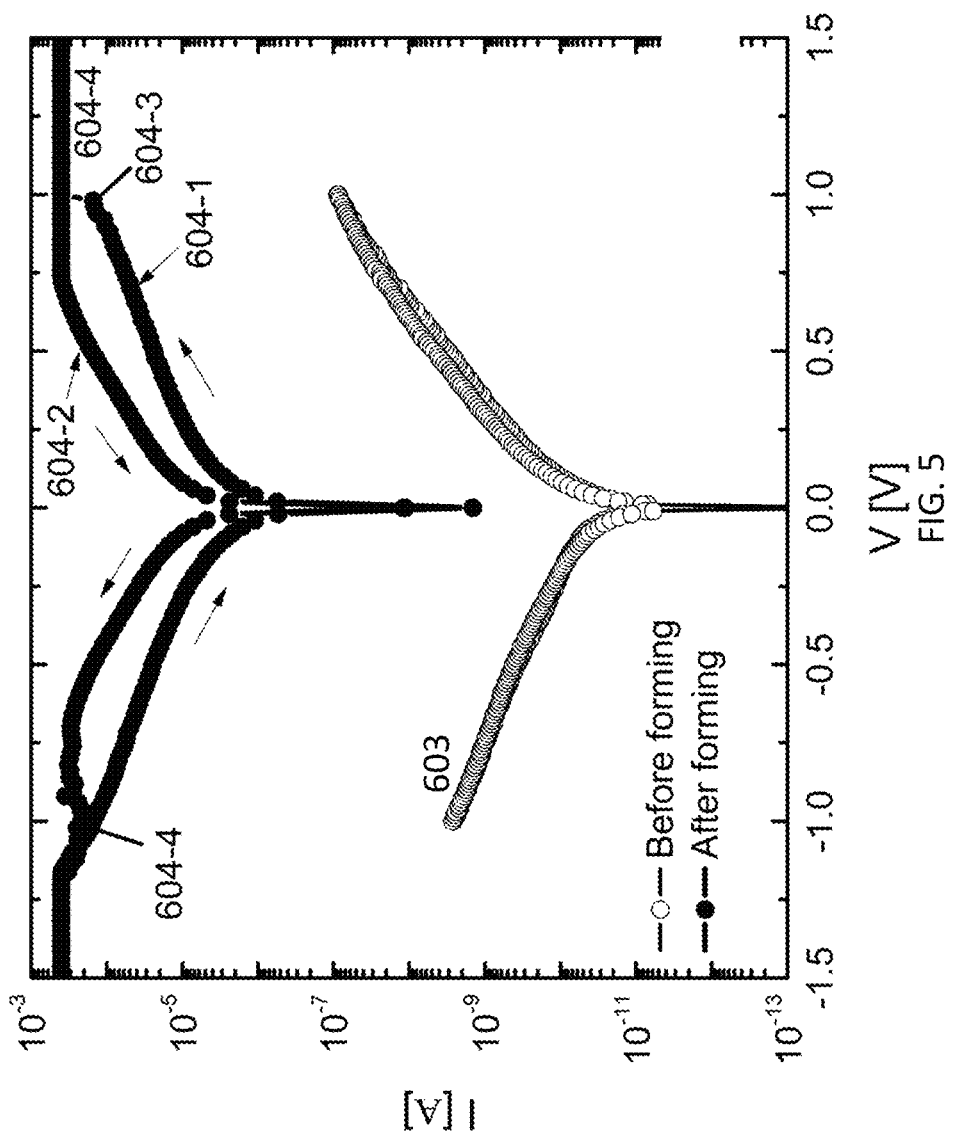
FIG. 5 is an exemplary IV graph illustrating characteristics of the RRAM device of FIG. 1 for a vertical $MoTe_2$ device.

Referring to FIG. 5, an exemplary IV graph illustrating characteristics of the RRAM device of FIG. 1 is provided for a vertical $MoTe_2$ device from a flake with a thickness of about 24 nm. More specifically, the graphs in FIG. 5 show the dependence of current I on the applied voltage V initially in an unformed state 603 as shown by a curve of hollow circles and then the device transitioning to a formed state 604 including a high resistance state (HRS) 604-1 and a low resistive state (LRS) 604-2 as shown by a curve of solid circles. The characteristic 603 of FIG. 1 is reproducible and substantially does not change after multiple scans between −1 V and 1 V as shown by hollow circles. The situation however changes when the voltage range is extended to a forming voltage. While not fully shown in FIG. 5, the forming voltage $V_{Forming}$ is described in fuller detail below. The cell 100 of FIG. 1 can transition into a formed state 604 and remain in that state indefinitely as illustrated. The formed state includes a set voltage represented by 604-3 at which point the cell 100 transitions from the HRS 604-1 to LRS 604-2 and a reset voltage 604-4 at which point the cell 100 transitions from the LRS 604-2 back to the HRS 604-1. Once the cell 100 is transitioned into the formed state 604, it remains in that state indefinitely and by sweeping the voltage it can be set and reset (i.e., transition from the HRS 604-1 to LRS 604-2 and back to HRS 604-1). The set voltage depends on the active material layer 108 thickness. In the depicted embodiment, the cell 100 has a set voltage $V_{SET}$ of between about 1 V to about 1.2 V. After the forming event, device characteristics can be cycled to exhibit typical bipolar RRAM type of behavior in terms of: a) remaining in their LRS 604-2 when no voltage is applied, b) preserving the low resistive state over an appreciable voltage range until a sufficient reset voltage (here $V_{RESET}$ is between about −0.9 V and −1.1 V) of polarity opposite to the set voltage is reached, and c) remaining in their respective HRS 604-1 until the set voltage is reached. In this case, the $MoTe_2$ flake thickness is about 7 nm. Note, the device can be formed by negative voltage, then the set voltage polarity would be negative and reset voltage polarity would be positive. It should be appreciated that the entirety of the cycle described herein could have started with negative voltages instead of positive voltages resulting in negative set and reset negative voltages.

Figure 6:
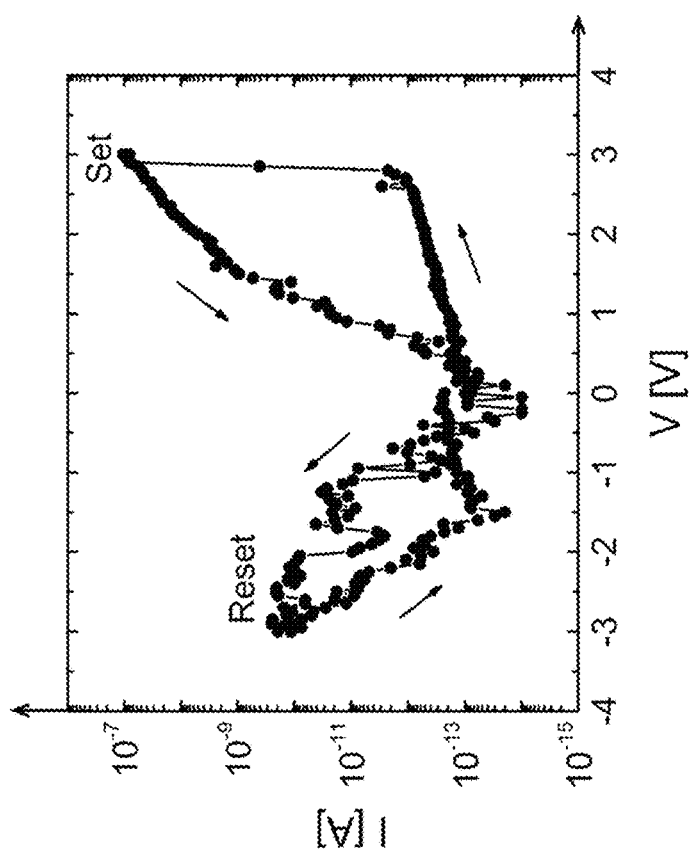
FIG. 6 is an exemplary IV graph illustrating characteristics of the RRAM device of FIG. 2.

Referring to FIG. 6, an exemplary IV graph illustrating characteristics of the cell 200 (shown in FIG. 2) is provided. More specifically, the graph in FIG. 6 shows dependence of current I from the applied voltage V. With the tunneling barrier 206 (see FIG. 2) in place, the current I through the cell 200 is reduced to 0.1 μA (shown in FIG. 6) in the depicted embodiment. The cell 200 is set into LRS without the transitioning from an unformed state into a formed state described above with respect to FIG. 5 (called forming-free) and the LRS does not require introducing any current compliance through an external circuitry (not shown, however, can be accomplished by a semiconductor parameter analyzer or even by a simple circuit including a biased transistor or a switching field effect transistor, as known to a person having ordinary skill in the art), another desirable feature in RRAM cells. The set/reset voltage depends on the thicknesses of the active layer material 208 and the tunneling barrier 206. It should be appreciated that wherever in the present disclosure samples are discussed with respect to the forming process, that such samples refer to FIGS. 1 and 7A, in which no tunneling barrier layer 206 (see FIG. 2) exists. However, where samples are discussed with such tunneling barrier 206, those portions refer to samples whereby no forming is needed.

Figure 7B:
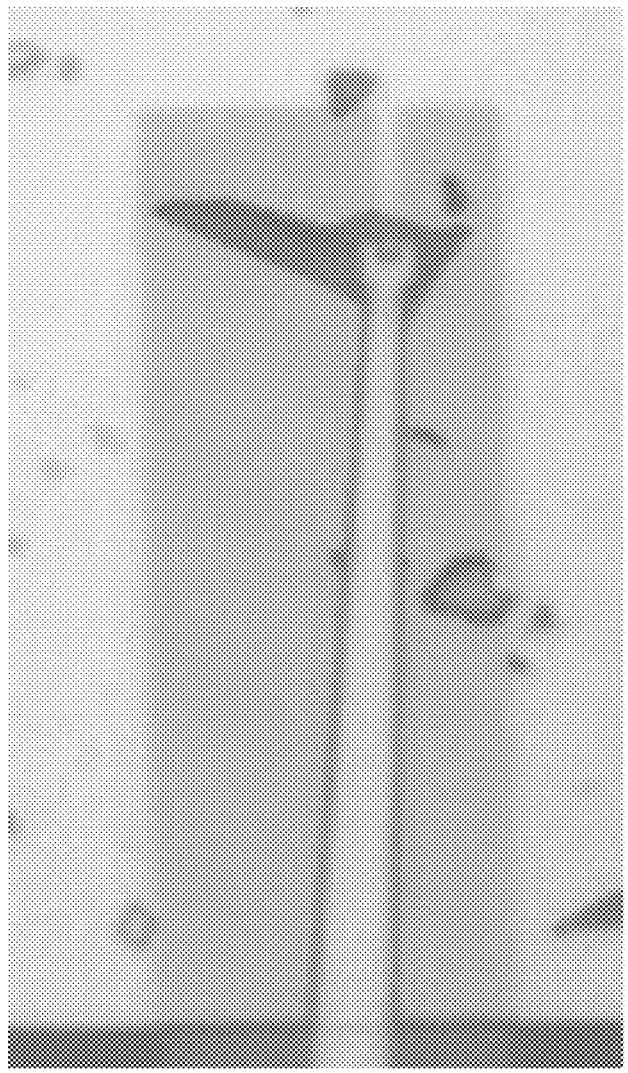
FIG. 7B is an optical image of the cell shown in FIG. 7A.
Figure 7C:
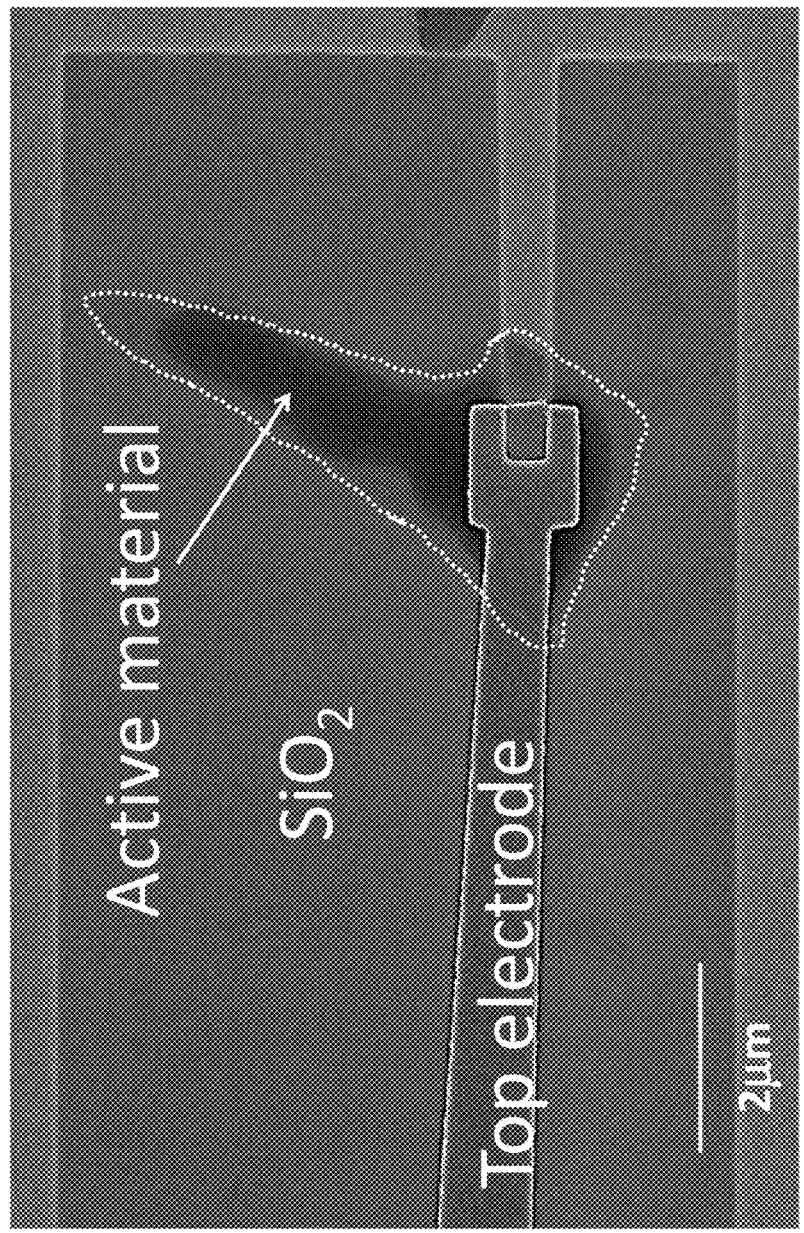
FIG. 7C is a scanning electron microscopy (SEM) image of the cell shown in FIG. 7A.

Referring to FIG. 7A, a perspective schematic of a vertical transition metal dichalcogenide (TMD) RRAM device also shown in FIG. 1 is shown, according to the present disclosure. Correspondingly, referring to FIGS. 7B and 7C optical and scanning electron microscopy (SEM) images of the cell shown in FIG. 7A are shown, respectively. The second electrode 112 (FIG. 7A) contact area is between about 0.01 μm² to about 0.5 μm² according to one exemplary embodiment. The cell shown in FIG. 7A ensures that only vertical transport occurs from the first electrode 104 to the second electrode 112 without any lateral transport contributions. Because of the large aspect ratio between the second electrode 112 area and the flake thickness of the active material 108, spreading resistance contributions can be ignored and the active device area is substantially identical to the top contact area.

Figure 8:
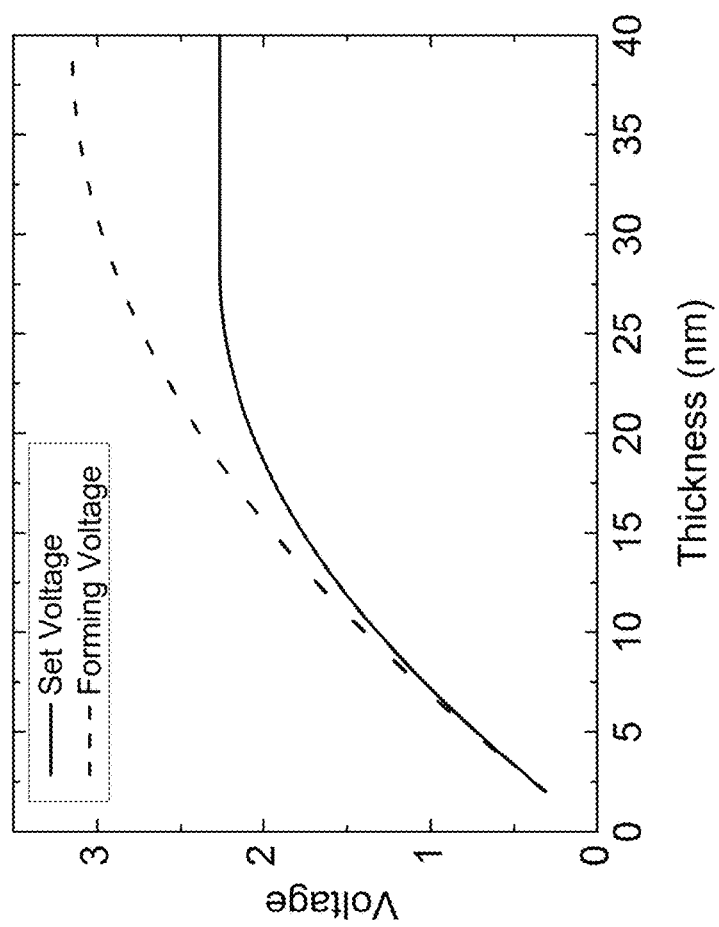
FIG. 8 is a graph of forming/set voltage in volts vs. flake thickness in nm for $MoTe_2$.

The relationship below provides a relationship between forming/set voltage vs. flake thickness which is shown FIG. 8. The curve fit is based on the following formula:

$$V_{Forming} = E_{CR} \cdot T_{MoTe_2} - qn_1/2k_s\varepsilon_0 T_{MoTe_2}^2,$$

$$V_{Set} = E_{CR} \cdot T_{MoTe_2} - qn_2/2k_s\varepsilon_0 (T_{MoTe_2} - d_{gap})^2,$$

where $V_{Forming}$ is the forming voltage and $V_{set}$ is the set voltage, $E_{CR}$ is electric field and according to one embodiment is about 0.16 V/nm, $d_{Gap}$ represents the distance of ruptured filament during the reset process and according to one embodiment is about 2.1 nm, $K_s$ is relative permittivity and according to one embodiment is about 8 for $MoTe_2$, q is electric charge and is about $1.6 \cdot 10^{-19}$ C, $n_1$ is charge concentration in the $MoTe_2$ material and according to one embodiment is about $1.8 \cdot 10^{24}$ m$^{-3}$, $n_2$ is charge concentration in the formed filament and according to one embodiment is about $2.5 \cdot 10^{24}$ m$^{-3}$, $\varepsilon_0$ is permittivity in vacuum which is about $8.85 \cdot 10^{-14}$ F/cm, and $T_{MoTe_2}$ is the flake thickness which according to one embodiment is between about 0.6 nm and 40 nm. The relationship provided in the above equation can be used to determine $V_{Forming}$ and $V_{set}$ voltages for differing characteristics.

Figure 9:
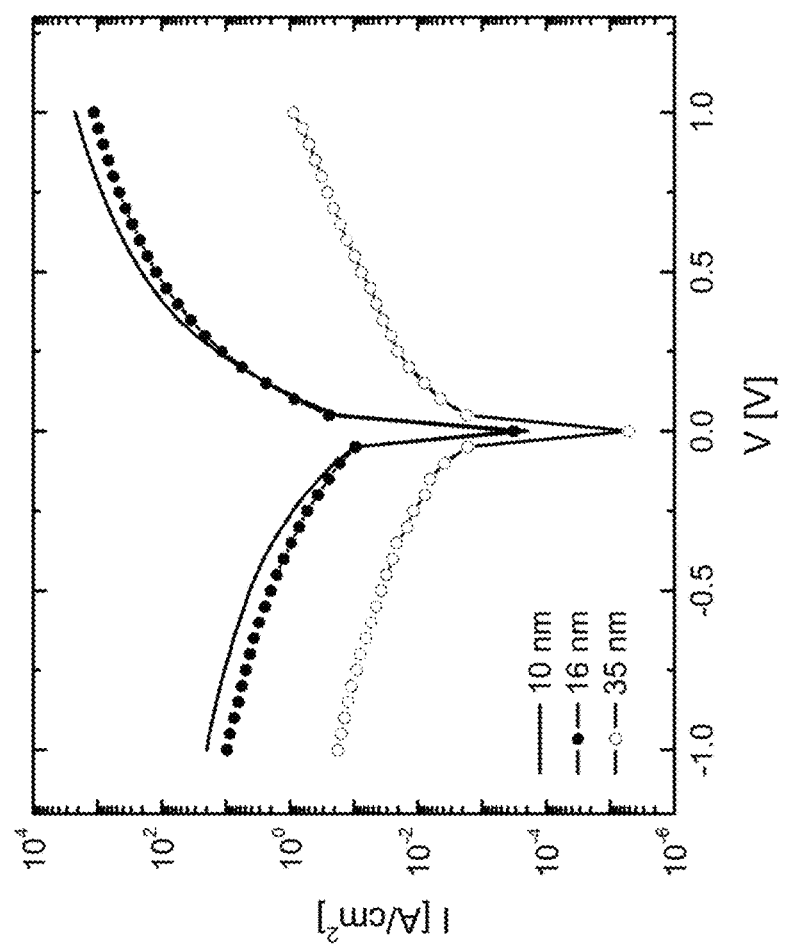
FIG. 9 is a graph of current (I) in $A/cm^2$ vs. voltage (V) in volts representing normalized IV curves of an exemplary vertical $MoTe_2$ device lacking tunneling barriers.

Referring to FIG. 9 area normalized IV curves of exemplary vertical $MoTe_2$ device before forming are shown for devices lacking a tunneling barrier (example cell 100 in FIG. 1). The first electrode (104 in FIG. 1) is grounded. The results shown confirm the expected trend of current densities with thickness, i.e., the thinner the flakes the higher current densities. The device characteristics shown are reproducible and they remain substantially the same after several scans between −1 V and 1 V. However, when the voltage range is extended beyond −1 V to 1 V, the results change. In particular, vertical MoTe$_2$ TMD devices transition into LRS as discussed in FIG. 5.

The details on the forming process are discussed below. As long as a critical forming voltage which depends on TMD thickness is not reached, the pristine metal-MoTe$_2$-metal devices exhibit reproducible IV curves shown as hollow circles in FIG. 5. Progressing beyond this forming voltage results in the RRAM behavior as described above, resulting in the resistive switching behavior. Two factors contribute to the forming: external electric fields and Joule heating are both factors during the formation of conductive filaments. However, once a filament is formed, a voltage lower than the forming voltage (i.e., a set voltage) is used to switch between the HRS and LRS of the cell. A transition back to the HRS occurs when a reverse polarity electric field is applied, due to a rupture of filaments. It should be appreciated that the set voltage discussed here depends monotonically on the flake thickness for flakes with thicknesses below about 15 nm (see FIG. 8) necessitating in that a critical electric field is needed to trigger the memristive behavior. Set values as shown in FIG. 8 have been experimentally found to vary by about 0.2 V due to device-to-device variations in these prototype structures. It should also be appreciated that after the aforementioned forming process has occurred, the state defined by the HRS remains more conductive than the original state of the device (i.e., solid circles in HRS 604-1 state are higher on the current curve than hollow circles representing pre-formation in FIG. 5) which is indicative that a permanent electronic change has occurred in the device. Along the same line, with reference to FIG. 5, the current ratio between the HRS and the LRS is about 50 but can be between about 10 and about 100 when the compliance is set to about 400 µA.

Figure 10A:
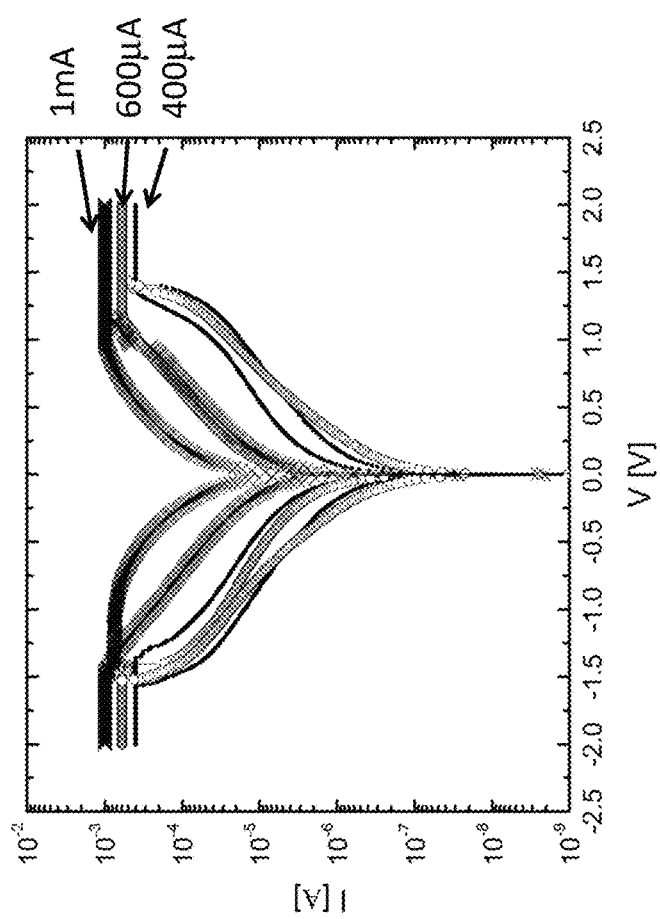
FIG. 10A is a graph of an exemplary IV graph illustrating current compliance characteristics of a $MoTe_2$-based RRAM device.
Figure 10B:
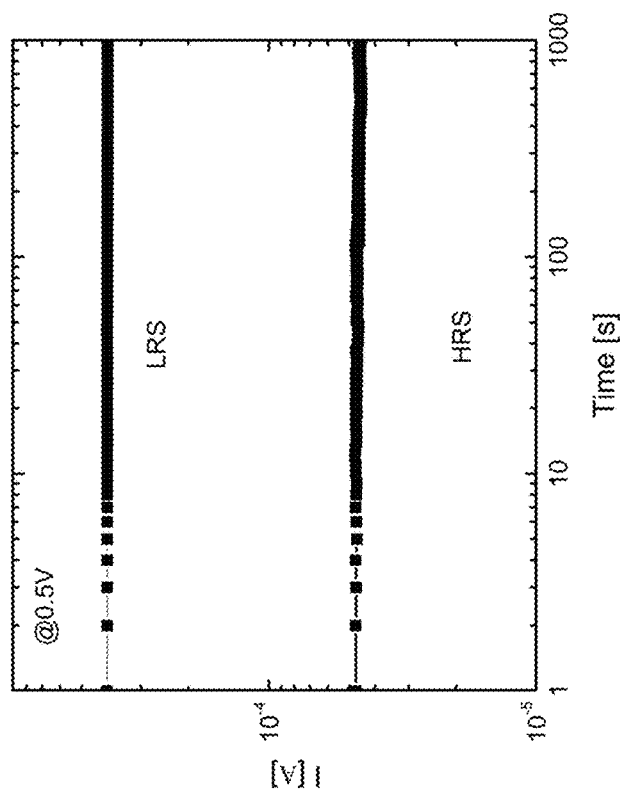
FIG. 10B is a graph of an exemplary current vs. time graph showing read disturb measurements on a representative $MoTe_2$ device.

To further understand the switching mechanism in TMDs, exfoliated MoTe$_2$ based RRAM cells with thicknesses between about 6 nm and about 36 nm were fabricated. All cells were nonvolatile and stable. When considering a metal oxide-based RRAM cell, a set current compliance can be used to control the LRS resistance which then determines the diameter and/or the number of conductive filaments formed in the LRS. Conversely, the reset voltage through the modulation of the ruptured filament length can be used to change the HRS resistance. Referring to FIG. 10A, IV curves for different current compliance values (1 mA, 600 µA, and 400 µA) are provided for MoTe$_2$-based RRAM cells. As discussed above, the current compliance is inversely related to the LRS resistance, which means that a higher current compliance results in a lower LRS resistance. In FIG. 10A the flake thickness for the device is about 15 nm. FIG. 10B is a graph of current vs. time (s) which shows the performance of the same device under a 0.5 V read disturb with the current compliance set to 1 mA. As shown, both states show a stable resistance over a period of time (e.g., 1000 s) at room temperature.

Figure 11:
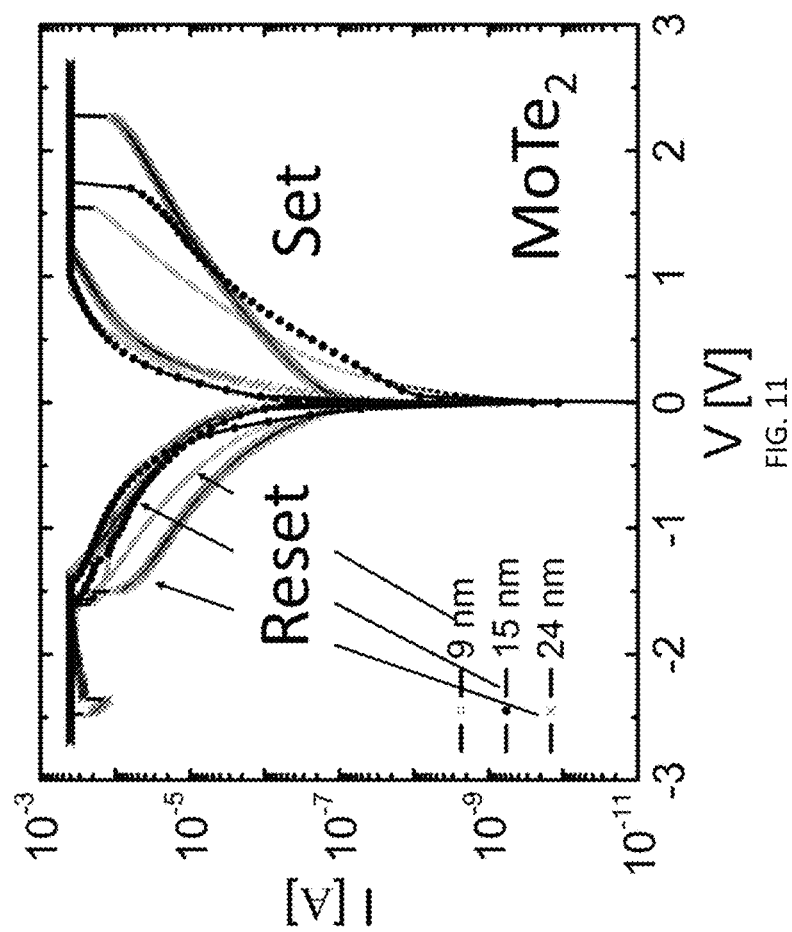
FIG. 11 shows representative IV curves for various $MoTe_2$ thicknesses corresponding to moderate fields.

For flake thicknesses from about 6 nm to about 36 nm, the set voltages can be tuned from 0.9 V to 2.3 V. Referring to FIG. 11 the set voltages in the representative IV curves are shown corresponding to moderate fields in the range of about 10$^6$ V/cm. It should be appreciated that the RRAM behavior is independent of the choice of contact metal. As an example, using Ni instead of Ti/Ni as top electrode resulted in the same RRAM performance.

The inventive novel phase transition-based RRAM disclosed herein has favorable combination of characteristic for use in the realm of neuromorphic computing. Although embodiments have been disclosed for a novel switching mechanism RRAM, it should be understood that the fabrication techniques and resulting structures and architecture are also used in in-memory computing or memristor-based nonvolatile logics circuits and devices, such as nonvolatile-SRAM (nvSRAM), nonvolatile flip-flops (nVFF), and nonvolatile TCAM (nvTCAM).

Those having ordinary skill in the art will recognize that numerous modifications can be made to the specific implementations described above. The implementations should not be limited to the particular limitations described. Other implementations may be possible.

The invention claimed is:

1. A resistive random access memory, comprising:
   a substrate;
   a first electrode formed atop the substrate;
   an active material formed atop the first electrode,
   an isolation layer formed atop the active material; and
   a second electrode formed atop the isolation layer,
   the first electrode and the second electrode provide electrical connectivity to external components,
   wherein the active material is a phase change material which undergoes phase transition in the presence of an electric field, Joule heating, or a combination thereof,
   the isolation layer includes a current path arrangement between the second electrode and the active material, wherein the current path arrangement includes a window about 20 nm to about 2 µm in width and about 20 nm to about 2 µm in length, and
   the isolation layer is made of a material selected from the group consisting essentially of silicon dioxide (SiO$_2$), boron nitride (BN), aluminum oxide (Al$_2$O$_3$), hafnium dioxide (HfO$_2$), polymers and combinations thereof.

2. The resistive random access memory of claim 1, wherein once a forming voltage is applied to the first and second electrode causes the active material to transition from an unformed state representing a pristine atomic disposition of the active material to a formed state representing a realignment of atoms in the active material.

3. The resistive random access memory of claim 1, wherein the active material is an electric filed induced phase transition material selected from the group consisting essentially of MoTe$_2$, GaTe, ReSe$_2$, and ReS$_2$.

4. The resistive random access memory of claim 3, wherein the set voltage is determined based on the thickness of the active material based on:

$$V_{Forming} = E_{CR} \cdot T_{MoTe_2} - qn_1 / 2k_s \varepsilon_0 T_{MoTe_2}^2,$$

$$V_{Set} = E_{CR} \cdot T_{MoTe_2} - qn_2 / 2k_s \varepsilon_0 (T_{MoTe_2} - d_{gap})^2,$$

wherein
where $V_{Forming}$ is the forming voltage and $V_{set}$ is the set voltage,
$E_{CR}$ is electric field and is about 0.16 V/nm,
$d_{Gap}$ represents the distance of ruptured filament during the reset and is about 2.1 nm,
$K_s$ is relative permittivity and is about 8 for MoTe$_2$,
$q$ is electric charge and is about $1.6 \cdot 10^{-19}$ C,
$n_1$ is charge concentration in the MoTe$_2$ material is about $1.8 \cdot 10^{24}$ m$^{-3}$,
$n_2$ is charge concentration in the formed filament and is about $2.5 \cdot 10^{24}$ m$^{-3}$,
$\varepsilon_0$ is permittivity in vacuum which is about $8.85 \cdot 10^{-14}$ F/cm, and $T_{MoTe_2}$ is the flake thickness which is between about 0.6 nm and 40 nm.

5. The resistive random access memory of claim 4, the substrate is made from material selected form the group consisting of silicon, silicon dioxide, glass, sapphire, germanium, gallium arsenide, indium phosphate, alloys of silicon and germanium, titanium oxide, polyethylene (PE), biaxially oriented polypropylene (BOPP), polyethylene terephthalate (PET), polyvinyl chloride (PVC) and combinations thereof.

6. The resistive random access memory of claim 5, the first and second electrodes are made from material selected from the group consisting essentially of aluminum, copper, gold, silver, polysilicon, molybdenum, nickel, indium tin oxide (ITO), graphene, carbon nanotubes (CNT), silver nanowires (AgNWs), conductive polymer, and combinations thereof.

7. The resistive random access memory of claim 1, wherein when the active material is $MoTe_2$ the set voltage is between about 0.4 V and about 2.3 V for a thickness of between about 3 nm to about 40 nm.

8. The resistive random access memory of claim 1, wherein the window of the current path arrangement is replaced with a plurality of vias providing substantially same amount of surface area.

9. A resistive random access memory, comprising:
a substrate;
a first electrode formed atop the substrate;
a tunneling barrier layer formed atop the first electrode;
an active material formed atop the tunneling barrier layer;
an isolation layer formed atop the active material; and
a second electrode formed atop the isolation layer,
the first electrode and the second electrode provide electrical connectivity to external components,
the isolation layer is made of a material selected from the group consisting essentially of silicon dioxide ($SiO_2$), boron nitride (BN), aluminum oxide ($Al_2O_3$), hafnium dioxide ($HfO_2$), polymers, and combinations thereof,
the isolation layer includes a current path arrangement between the second electrode and the active material,
wherein the current path arrangement includes a window about 20 nm to about 2 μm in width and about 20 nm to about 2 μm in length,
wherein the active material is a phase change material which undergoes phase transition in the presence of an electric field, Joule heating, or a combination thereof.

10. The resistive random access memory of claim 9, wherein once a forming voltage is applied to the first and second electrode causes the active material to transition from an unformed state representing a pristine atomic disposition of the active material to a formed state representing a realignment of atoms in the active material.

11. The resistive random access memory of claim 9, wherein the substrate is made from material selected form the group consisting of silicon, silicon dioxide, glass, sapphire, germanium, gallium arsenide, indium phosphate, alloys of silicon and germanium, titanium oxide, polyethylene (PE), biaxially oriented polypropylene (BOPP), polyethylene terephthalate (PET), polyvinyl chloride (PVC), and combinations thereof.

12. The resistive random access memory of claim 11, wherein the tunneling barrier layer is made of material selected from the group consisting essentially of silicon dioxide ($SiO_2$), aluminum oxide ($Al_2O_3$), hafnium dioxide ($HfO_2$), boron nitride (BN), $MoS_2$, $WSe_2$, $MoSe_2$, and a combination thereof.

13. The resistive random access memory of claim 12, wherein the active material is $MoTe_2$.

14. The resistive random access memory of claim 13, the first and second electrodes are made from material selected from the group consisting essentially of aluminum, copper, gold, silver, polysilicon, molybdenum, nickel, indium tin oxide (ITO), graphene, carbon nanotubes (CNT), silver nanowires (AgNWs), conductive polymer, and combinations thereof.

15. The resistive random access memory of claim 9, wherein the window of the current path arrangement is replaced with a plurality of vias providing substantially same amount of surface area.

* * * * *